United States Patent
Gong et al.

(10) Patent No.: US 9,711,662 B1
(45) Date of Patent: Jul. 18, 2017

(54) INTEGRATED CIRCUITS WITH OPTICAL MODULATORS AND PHOTODETECTORS AND METHODS FOR PRODUCING THE SAME

(71) Applicant: Globalfoundries Singapore Pte. Ltd., Singapore (SG)

(72) Inventors: Shunqiang Gong, Singapore (SG); Benfu Lin, Singapore (SG); Juan Boon Tan, Singapore (SG); Ramakanth Alapati, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/134,542

(22) Filed: Apr. 21, 2016

(51) Int. Cl.
- *H01L 31/02* (2006.01)
- *H01L 31/0232* (2014.01)
- *H01L 31/18* (2006.01)

(52) U.S. Cl.
CPC .. *H01L 31/02002* (2013.01); *H01L 31/02327* (2013.01); *H01L 31/18* (2013.01)

(58) Field of Classification Search
None
See application file for complete search history.

(56) References Cited

U.S. PATENT DOCUMENTS

| | | | |
|---|---|---|---|
| 6,150,260 A | 11/2000 | Roy | |
| 6,569,770 B2 | 5/2003 | Wang et al. | |
| 8,290,325 B2 * | 10/2012 | Reshotko | G02B 6/1228 385/129 |
| 8,664,739 B2 * | 3/2014 | King | H01L 27/14632 257/186 |
| 9,048,371 B2 * | 6/2015 | Ang | H01L 31/1075 |
| 9,372,307 B1 * | 6/2016 | Budd | G02B 6/122 |
| 2003/0057561 A1 * | 3/2003 | Fukuyama | H01L 21/76813 257/774 |
| 2012/0001283 A1 * | 1/2012 | Assefa | H01L 31/1085 257/431 |
| 2012/0288971 A1 * | 11/2012 | Bogaerts | H01L 31/105 438/24 |
| 2016/0056115 A1 * | 2/2016 | Kunishima | H01L 23/60 385/14 |

* cited by examiner

*Primary Examiner* — Benjamin Sandvik
(74) *Attorney, Agent, or Firm* — Lorenz & Kopf, LLP

(57) ABSTRACT

Integrated circuits and methods of producing such integrated circuits are provided. In an exemplary embodiment, a method of producing an integrated circuit includes forming an upper interlayer dielectric overlying an optical modulator and a photodetector, where the photodetector has a shoulder and a plug. An etch stop is formed overlying the upper interlayer dielectric. The etch stop is a first, second, and third distance from an uppermost surface of the optical modulator, the shoulder, and the plug, respectively, where the first, second, and third distances are all different from each other. A first, second, and third contact are formed through the upper interlayer dielectric, where the first, second and third contacts are in electrical communication with the optical modulator, the shoulder, and the plug, respectively.

20 Claims, 5 Drawing Sheets

INTEGRATED CIRCUITS WITH OPTICAL MODULATORS AND PHOTODETECTORS AND METHODS FOR PRODUCING THE SAME

TECHNICAL FIELD

The technical field generally relates to integrated circuits with optical modulators and photodetectors and methods of producing the same, and more particularly relates to integrated circuits with contacts of varying lengths extending to the optical modulators and photodetectors, and methods of producing the same.

BACKGROUND

The semiconductor industry is continuously moving toward the fabrication of smaller and more complex microelectronic components with higher performance. The production of smaller integrated circuits requires the development of smaller electronic components, and closer spacing of those electronic components within the integrated circuits. Some integrated circuits include optical components, and inexpensive and reliable manufacturing processes for such components can improve quality and reduce costs.

Many integrated circuits include optical modulators and photodetectors formed within an interlayer dielectric. Electrical contacts typically extend to two different parts of the photodetector and to the optical modulator such that the integrated circuit has contacts with three different lengths. The contacts are formed from an electrically conductive material, and excess overburden is removed after the contacts are formed. The removal of the overburden can remove some of the interlayer dielectric over the photodetector such that the operation of the photodetector is impaired or destroyed. Also, the simultaneous formation of contacts with different lengths can produce a short to the photodetector, where the short also impairs or destroys operation of the photodetector. Furthermore, the varying lengths and aspect ratios for the contacts make the via etch process for the contacts difficult to control.

Accordingly, it is desirable to provide integrated circuits with optical modulators and photodetectors where the interlayer dielectric overlying the components is consistently in good condition and properly sized, and methods of producing the same. In addition, it is desirable to provide integrated circuits with optical modulators and photodetectors where the contact formation process is well controlled and consistent. Furthermore, other desirable features and characteristics of the present embodiment will become apparent from the subsequent detailed description and the appended claims, taken in conjunction with the accompanying drawings and this background.

BRIEF SUMMARY

Integrated circuits and methods of producing such integrated circuits are provided. In an exemplary embodiment, a method of producing an integrated circuit includes forming an upper interlayer dielectric overlying an optical modulator and a photodetector, where the photodetector has a shoulder and a plug. An etch stop is formed overlying the upper interlayer dielectric. The etch stop is a first, second, and third distance from an uppermost surface of the optical modulator, the shoulder, and the plug, respectively, where the first, second, and third distances are all different from each other. A first, second, and third contact are formed through the upper interlayer dielectric, where the first, second and third contacts are in electrical communication with the optical modulator, the shoulder, and the plug, respectively.

A method of producing an integrated circuit is provided in another embodiment. The method includes forming an upper interlayer dielectric overlying an optical modulator and a photodetector, where the photodetector includes a shoulder and plug, and where the plug is about 60 weight percent or more germanium. A third contact is formed through the upper interlayer dielectric. The third contact includes about 60 weight percent or more copper, and the third contact physically contacts the plug.

An integrated circuit is provided in yet another embodiment. The integrated circuit includes an optical modulator and a photodetector overlying a substrate, where the photodetector includes a shoulder and a plug. An upper interlayer dielectric overlies the optical modulator and the photodetector, and an etch stop overlies the upper interlayer dielectric. A first contact, a second contact, and a third contact pass through the upper interlayer dielectric, where the first, second, and third contacts are in electrical communication with the optical modulator, the shoulder, and the plug, respectively.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for producing the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Figure 1:
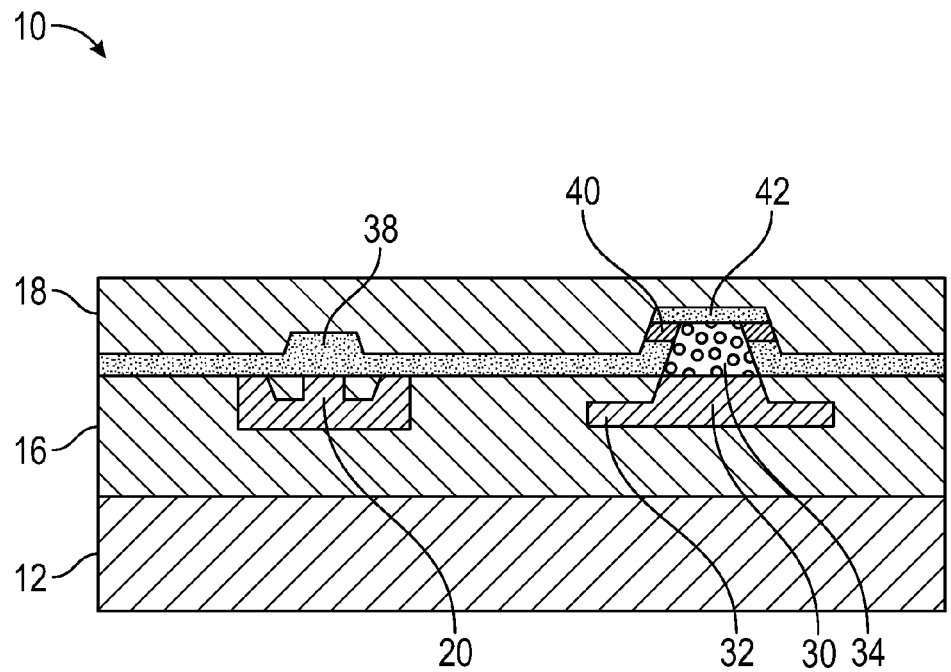
FIGS. 1-9 are cross-sectional views illustrating portions of an integrated circuit and methods for its production in accordance with exemplary embodiments.

Reference is made to an exemplary embodiment illustrated in FIG. 1. An integrated circuit 10 is provided with a substrate 12 including semiconductor material. As used herein, the term "semiconductor material" will be used to encompass semiconductor materials conventionally used in the semiconductor industry from which to make electrical and/or optical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

A lower interlayer dielectric 16 is formed overlying the substrate 12, wherein the lower interlayer dielectric 16 includes an electrically insulating material. As used herein, the term "overlying" means "over" such that an intervening layer may lie between the lower interlayer dielectric 16 and the substrate 12, or "on" such that the lower interlayer dielectric 16 physically contacts the substrate 12. As used herein, an "electrically insulating material" is a material with a resistivity of about $1 \times 10^4$ ohm meters or more and an "electrically conductive material" is a material with a resistivity of about $1 \times 10^{-4}$ ohm meters or less. In an exemplary embodiment, the lower interlayer dielectric 16 includes silicon dioxide, which may be deposited by chemical vapor deposition using silane and oxygen or using tetraethyl orthosilicate (TEOS) and ozone, but other materials or deposition processes may be used in alternate embodiments.

An optical modulator 20 and a photodetector 30 are formed overlying the substrate 12 and overlying the lower interlayer dielectric 16, where the photodetector 30 has a shoulder 32 and a plug 34. The optical modulator 20 and the photodetector 30 may include monocrystalline silicone, which can be deposited by epitaxy using silicon tetrachloride and hydrogen, and the plug 34 may include germanium that can be deposited by chemical vapor deposition using germane. In an exemplary embodiment, the plug 34 includes germanium at about 60 weight percent or more, based on the total weight of the plug 34. In some embodiments, a cap layer 38 is formed overlying the optical modulator 20 and the photodetector 30, and the cap layer 38 overlies at least a portion of the lower interlayer dielectric 16 as well. The cap layer 38 may include silicon nitride, silicon carbon nitride, or other electrically insulating materials. Silicon nitride can be deposited using several techniques, including chemical vapor deposition using ammonia and dichlorosilane. A photodetector barrier 40 may be formed overlying the cap layer 38 and other parts of the photodetector 30, where the photodetector barrier 40 may be adjacent to a side surface of the plug 30. The photodetector barrier 40 may be silicon oxynitride in an exemplary embodiment, which can be formed by plasma enhanced chemical vapor deposition using nitrous oxide and silane. The plug 34 may be formed after the photodetector barrier 40, and a photodetector top cap 42 may be formed overlying the photodetector barrier 40 and the plug 30. The photodetector top cap 42 may be silicon nitride in an exemplary embodiment. In an exemplary embodiment, an upper interlayer dielectric 18 is formed overlying the optical modulator 20, the photodetector 30, and the cap layer 38. In an exemplary embodiment, the upper interlayer dielectric 18 includes the same material as the lower interlayer dielectric 16, but in alternate embodiments the upper interlayer dielectric 18 includes different material than the lower interlayer dielectric 16. The upper interlayer dielectric 18 is an electrically insulating material. The lower and upper interlayer dielectrics 16, 18 may be jointly referred to herein as the interlayer dielectric. The optical modulator 20 and photodetector 30 may be formed using known techniques.

Figure 2:
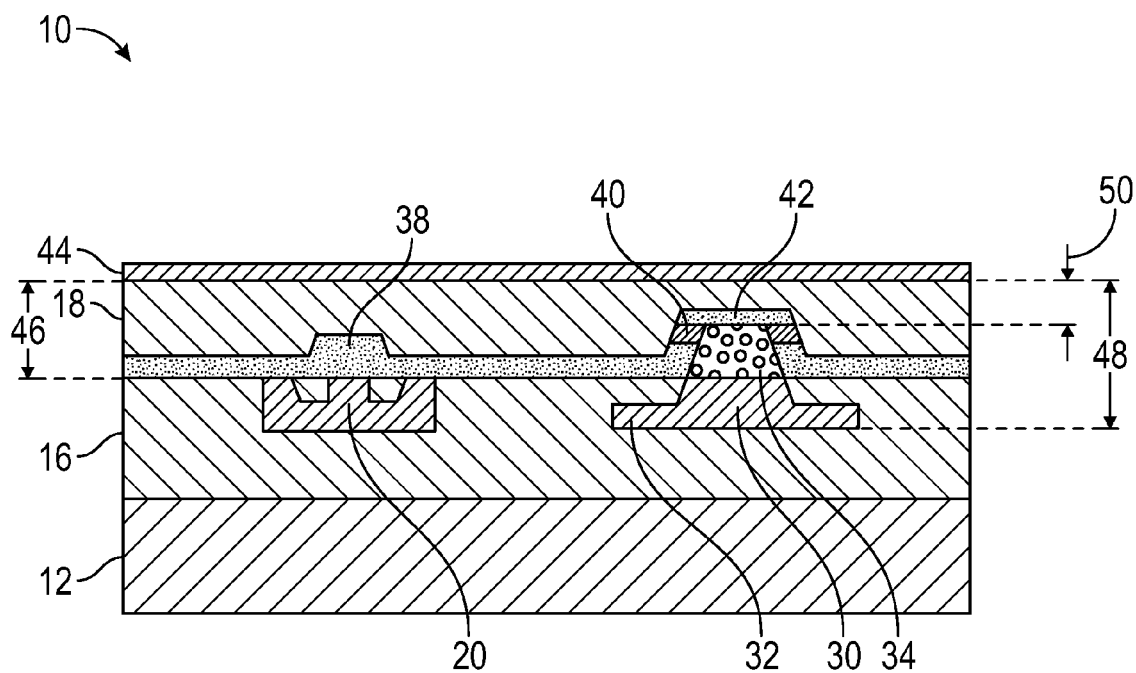

Referring to an exemplary embodiment illustrated in FIG. 2, an etch stop 44 is formed overlying the upper interlayer dielectric 18. The etch stop 44 includes silicon nitride in an exemplary embodiment, but the etch stop 44 may include silicon carbon nitride or other electrically insulating materials in alternate embodiments. Silicon nitride may be deposited by low pressure chemical vapor deposition using ammonia and dichlorosilane. The etch stop 44 is a first distance 46 from an uppermost surface of the optical modulator 20, a second distance 48 from an uppermost surface of the shoulder 32, and a third distance 50 from an uppermost surface of the plug 34, where the first, second, and third distances 46, 48, 50 may all be different from each other. In an exemplary embodiment, the first distance 46 is from about 3,000 to about 4,000 angstroms, the second distance 48 is from about 4,000 to about 6,000 angstroms, and the third distance 50 is from about 1,000 to about 2,000 angstroms. In some embodiments, the second distance 48 about 3 times the third distance 50, such as from about 2.5 to about 3.5 times the third distance 50.

Figure 3:
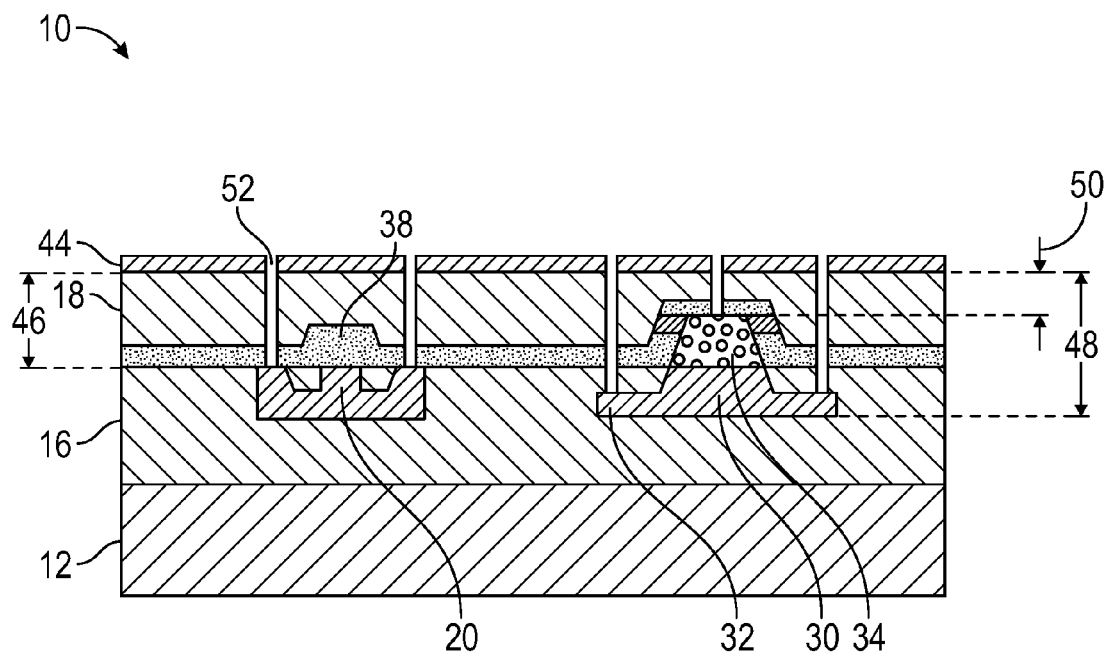

A plurality of vias 52 are formed through the etch stop 44 and the upper interlayer dielectric 18, as illustrated in an exemplary embodiment in FIG. 3. One or more vias 52 extend to the optical modulator 20, to the shoulder 32 of the photodetector 30, and to the plug 34. The vias 52 may be formed using lithography, where the etch stop 44 can serve as a hard mask when forming the vias 52. As such, a layer of photoresist (not illustrated) is patterned to expose the etch stop 44, and the etch stop 44 may then be removed at the desired locations. In an exemplary embodiment with a silicon nitride etch stop 44, the etch stop 44 may be patterned through the photoresist with a wet etch using hot phosphoric acid, but other methods may also be used. The vias 52 may then be formed through the upper interlayer dielectric 18, such as with a reactive ion etch using carbon tetrachloride. The cap layer 38 and the photodetector top cap 42 may be removed with a wet etch using hot phosphoric acid, and the lower interlayer dielectric 16 may be removed overlying the shoulder with anther reactive ion etch using carbon tetrachloride. The layer of photoresist (not illustrated) can be removed with an oxygen-containing plasma after use.

Figure 4:
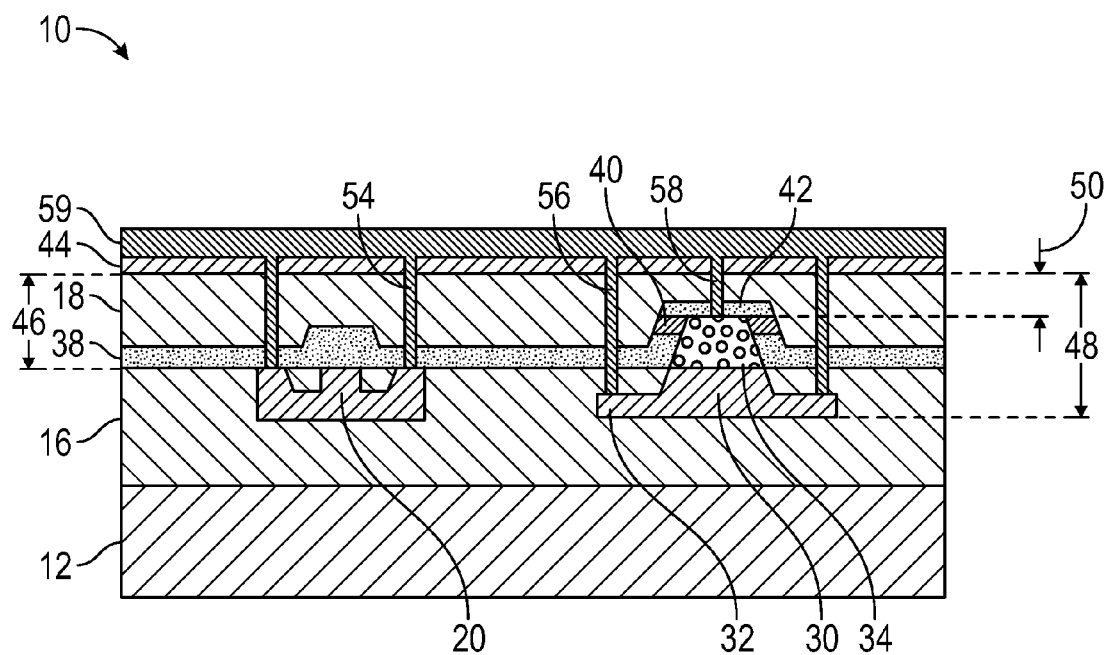

Referring to FIG. 4, with continuing reference to FIG. 3, a plurality of contacts are formed in the vias 52. In an exemplary embodiment, a first contact 54 is formed through the upper interlayer dielectric 18 to the optical modulator 20, a second contact 56 is formed through the upper interlayer dielectric 18 to the shoulder 32, and a third contact 58 is formed through the upper interlayer dielectric 18 to the plug 34. As such, the first contact 54 is in electrical communication with the optical modulator 20, the second contact 56 is in electrical communication with the shoulder 32, and the third contact 58 is in electrical communication with the plug 34. "Electrical communication" between two or more components, as used herein, means electrical current can flow between the different components, where the current may or may not flow through additional intervening components. "Electrical connection" between two or more components, as used herein, means electrical current can flow directly between the different components, such that the different components are either directly connected together or a conductive line directly connects the different components together with no intervening components between the different components that are electrically connected. In an exemplary embodiment, the first contact 54 physically contacts the optical modulator 20, the second contact 56 physically contacts the shoulder 32, and the third contact 58 physically contacts the plug 34.

The first, second, and third contacts 54, 56, 58 may be formed simultaneously, such as by depositing an electrically conductive material, such as tungsten, within the vias 52. In an exemplary embodiment, the first, second, and third contacts 54, 56, 58 include an adhesion layer, a barrier layer, and a core (not individually shown) which are sequentially deposited. For example, an adhesion layer of titanium may be formed by low pressure chemical vapor deposition of titanium pentachloride, a barrier layer of titanium nitride may be formed by chemical vapor deposition of titanium tetrabromide and ammonia, and a core of tungsten may be formed by chemical vapor deposition of tungsten hexafluoride and hydrogen. Other types of contacts are also possible, where the contacts are formed from electrically conductive materials. The first, second, and third contacts 54, 56, 58 extend from about the etch stop 44 to the optical modulator 20, the shoulder 32, and the plug 34, respectively. Therefore, the first, second, and third contacts 54, 56, 58 have lengths of about the first distance 46, second distance 48, and third distance 50, respectively, so the first, second, and third contacts 54, 56, 58 may all have different lengths. In some embodiments, the first, second, and third contacts 54, 56, 58 all have about the same width, so the different lengths mean the first, second, and third contacts 54, 56, 58 may all have different aspect ratios from one another.

Figure 5:
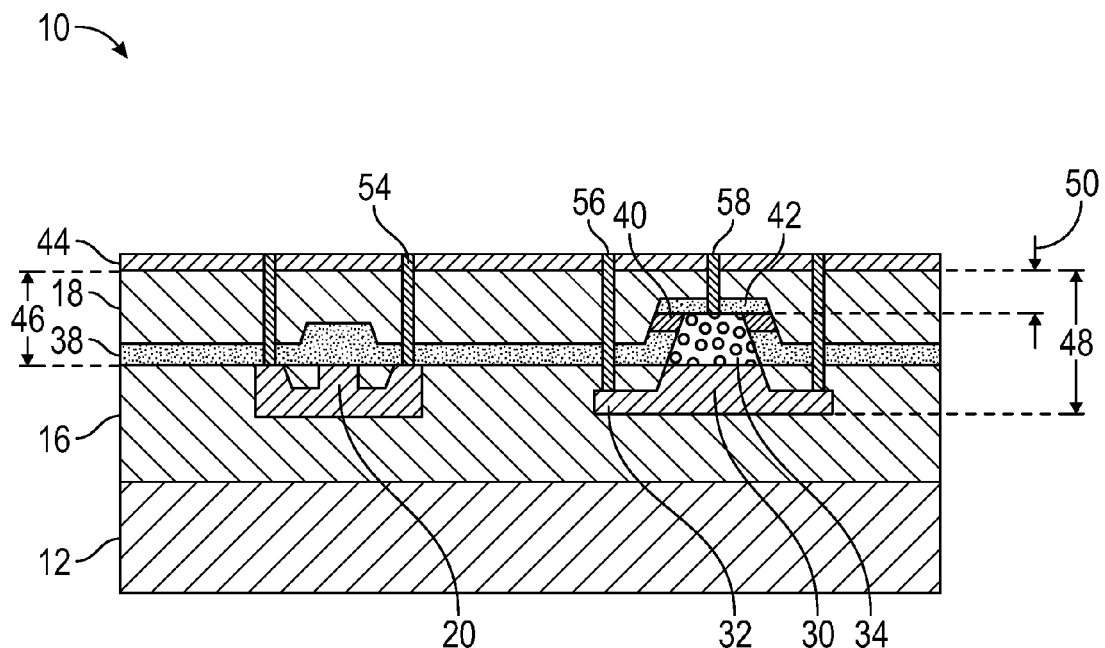

There may be a contact overburden 59 left overlying the etch stop 44 when the contact formation is complete. This contact overburden 59 can be removed, such as with chemical mechanical planarization, as illustrated in an exemplary embodiment in FIG. 5 with continuing reference to FIG. 4. The chemical mechanical planarization may electrically separate the first, second, and third contacts 54, 56, 58 because, after planarization, the first, second, and third contacts 54, 56, 58 are separated by electrically insulating materials. The etch stop 44 may serve to prevent excessive gouging into the upper interlayer dielectric 18 during the chemical mechanical planarization process, so the etch stop 44 protects the underlying components. This may produce a more uniform thickness of the upper interlayer dielectric 18 compared to planarization without an etch stop 44. The third distance 50 is relatively short, so the protection afforded by the etch stop 44 during planarization helps prevent dishing or gouging that could reduce the thickness of the upper interlayer dielectric 18 to below a critical thickness. This protection also reduces the likelihood of a short that can be caused by damage to the upper interlayer dielectric 18 during the planarization, as compared to a planarization without an etch stop 44. Furthermore, the chemical mechanical planarization may be terminated when nitrogen or other materials present in the etch stop 44 are detected in the removed materials, so an end point detection technique can be employed with the chemical mechanical planarization to more accurately terminate the planarization when the contact overburden 59 is removed. In addition, the use of the etch stop 44 as a hard mask during the formation of the vias 52 improves the accuracy of the via formation process, so the vias 52 have more consistent widths and positions than vias 52 formed without a hard mask. As such, the etch stop 44 provides several benefits for the integrated circuit production, and this may improve the quality of the integrated circuit 10 produced.

Figure 6:
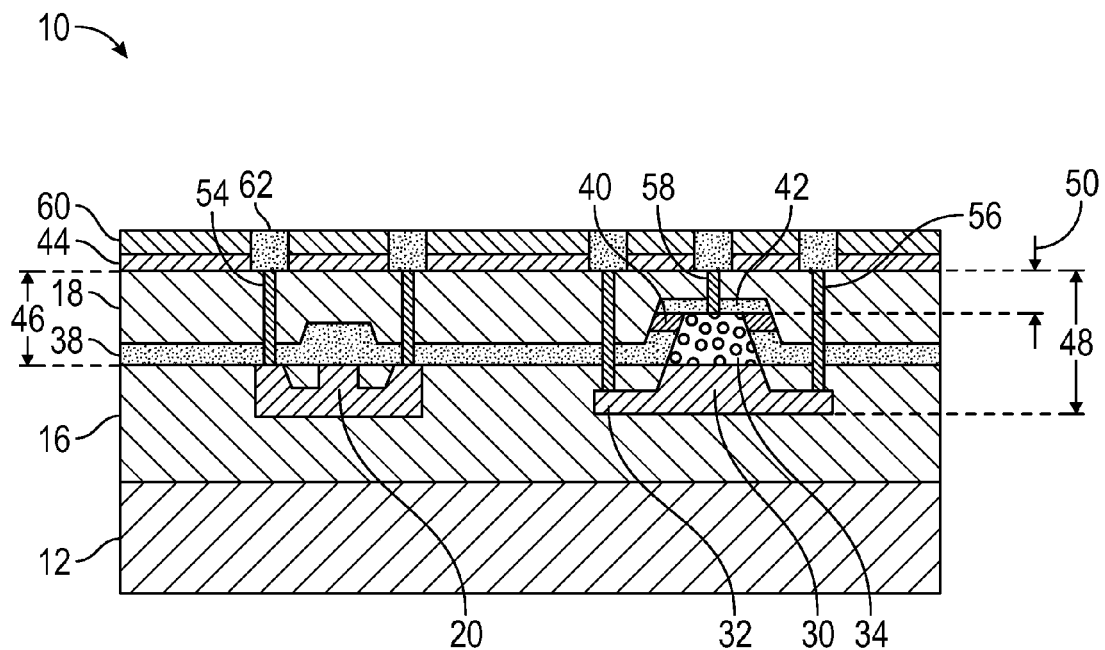

Referring to the exemplary embodiment illustrated in FIG. 6, a cover dielectric 60 is formed overlying the etch stop 44. In an exemplary embodiment, the cover dielectric 60 includes silicon dioxide, which can be formed by chemical vapor deposition using silane and oxygen, but the cover dielectric 60 may include other materials in alternate embodiments. The cover dielectric 60 is an electrically insulating material. An interconnect 62 may be formed in the cover dielectric 60, where the interconnect includes an electrically conductive material. The interconnect 62 includes copper in an exemplary embodiment, but other electrically conductive materials may be used in alternate embodiments. The interconnect 62 may be formed using a damascene process by forming a trench, depositing copper by electroless or electrolytic plating from a solution such as a sulfuric acid copper bath, and subsequent chemical mechanical planarization to remove a copper overburden. The trench may extend through the etch stop 44 such that, after formation, the interconnect 62 physically contacts the upper interlayer dielectric 18, In alternate embodiments, the trench may not extend through the etch stop 44 such that a portion of a contact extends above the upper interlayer dielectric 18 and is electrically connected to the interconnect 62, after formation. The interconnect 62 may be in electrical communication with the optical modulator 20 through the first contact 54. The same interconnect 62 and/or one or more different interconnects 62 may be in electrical communication with the photodetector 30 through the second and/or third contacts 56, 58.

Figure 7:
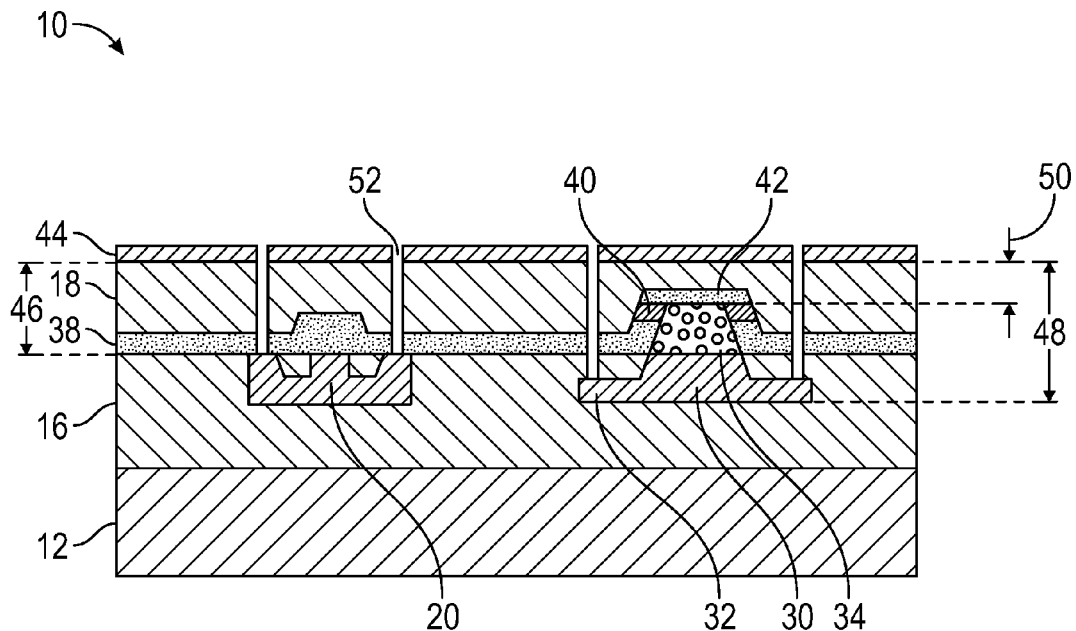
Figure 8:
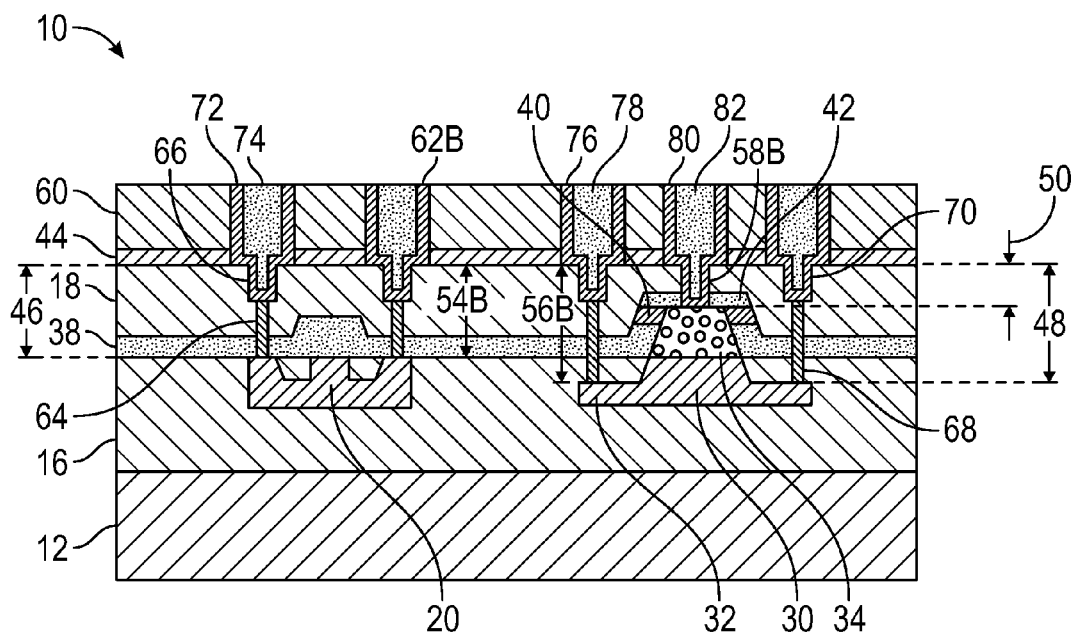

A different embodiment is illustrated in FIG. 7, with continuing reference to FIG. 6, where the via 52 for the third contact 58 is produced after the vias 52 for the first and second contacts 54, 56. The simultaneous formation of contacts having different lengths and aspect ratios can be challenging. However, delaying the formation of the via 52 for the third contact 58B until after the vias 52 for the first and second contacts 54, 56 are formed and filled means vias with only two different lengths are formed at one time. FIG. 7 illustrates an alternate method of manufacture and process beginning at FIG. 3 of the embodiment described above. The first and second contacts 54B, 56B are formed as described above, but the third contact 58B is not formed at the same time, as illustrated in FIG. 8 with continuing reference to FIG. 7. Specifically, after first and second contacts 54B, 56B are formed, the via formation process is repeated to form the via for the third contact 58B and the third contact 58B is then formed. Previously described components are referenced in this embodiment with a "B" for clarity. The interconnect 62B is formed using a dual damascene process, where part of the first and second contacts 54B, 56B are removed and replaced with copper or other conductive materials from the dual damascene process. As such, the first contact 54B has a lower first part 64 that may include tungsten, and an upper first part 66 that may include copper. In an exemplary embodiment, the lower first part 64 includes about 60 weight percent tungsten or more, and the upper first part 66 includes about 60 weight percent copper or more, based on the weight of the lower first part and the upper first part, respectively. The lower first part 64 reduces the copper concentration for the first contact 54B as a whole to less than 60 weight percent in an exemplary embodiment, based on the total weight of the first contact 54B (including the lower and upper first parts 64, 66). The lower first part 64 is electrically connected to the optical modulator 20, and the upper first part 66 is electrically connected to the lower first part 64 and to the interconnect 62B. In a similar manner, the second contact 56B has a lower second part 68 and an upper second part 70. The lower second part 68 may include about 60 weight percent tungsten or more, and the upper second part 70 may include about 60 weight percent copper or more, based on the weight of the lower second part and the upper second part, respectively. In some embodiments, the entire second contact 56B, which includes the lower and upper second parts 68, 70, includes less than about 60 weight percent copper, based on the total weight of the first contact 56B. Also, the lower second part 68 may be electrically connected to the shoulder 32, and the upper second part 70 may be electrically connected to the lower second part 68 and to the interconnect 62B.

The third contact 58B does not include a lower part formed from different materials than the upper part, so the third contact 58B does not include the materials of the lower first part 64 or the lower second part 68. As such, the third contact 58B may be about 60 weight percent copper or more, based on the total weight of the third contact 58B. As a result, the third contact 58B has a different composition than the first and second contacts 54B, 56B.

In an exemplary embodiment, each of the first, second, and third contacts 54B, 56B, 58B has a portion that includes copper, and this portion may include a barrier and a core, so the upper first part 66 may include a first barrier 72 and a first core 74, the upper second part 70 may include a second barrier 76 and a second core 78, and the third contact 58B may include a third barrier 80 and a third core 82. The first, second and third barriers 72, 76, 80 may include sequential layers of tantalum and tantalum nitride, but other materials may also be used. Tantalum and tantalum nitride may be deposited by chemical vapor deposition using tantalum pentafluoride, where nitrogen is added for tantalum nitride, but atomic layer deposition or other deposition methods may also be used in alternate embodiments. The first, second, and third cores 74, 78, 82 may be formed by depositing copper using electroless or electrolytic plating from a solution such as a sulfuric acid copper bath. Subsequent chemical mechanical planarization may be used to remove copper and tantalum overburden. The first, second, and third barriers 72, 76, 80 may help limit or prevent diffusion of copper from the first, second and third cores 74, 78, 82 into adjacent components.

Figure 9:
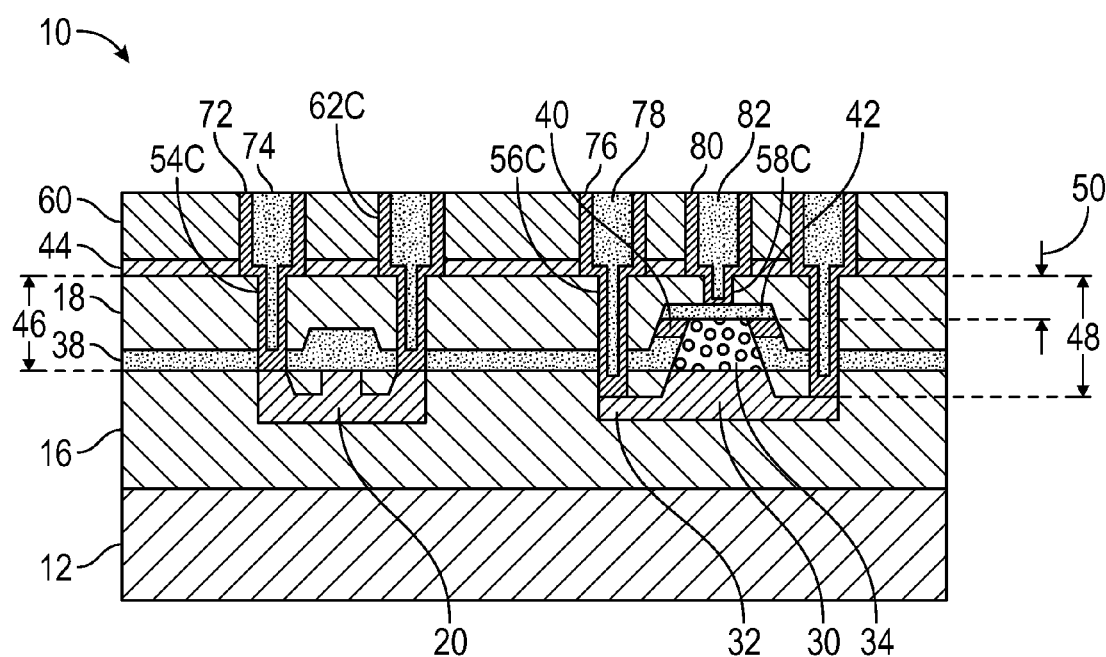

Yet another embodiment is illustrated in FIG. 9, with additional reference to FIGS. 3 and 8. Previously described components are referenced in this embodiment with a "C" for clarity. In this embodiment, the first, second, and third contacts 54C, 56C, 58C are formed using a dual damascene process, as described above for the upper part of the contacts, but no lower first part 64 or lower second part 68 are formed before the dual damascene process. As such, the first, second, and third contacts 54C, 56C, 58C may all be about 60 weight percent copper or more, based on the total weight of the first, second, and third contacts 54C, 56C, 58C, respectively. In this embodiment, the vias 52 (illustrated in FIG. 3) may not be filled with tungsten, as described above, so the manufacturing steps and costs associated with the tungsten contact process may be saved. The first, second, and third contacts 54C, 56C, 58C may be entirely formed with a dual damascene process, as described and illustrated in FIG. 8. Also, the first barrier 72 may directly contact the optical modulator 20, the second barrier 76 may directly contact the shoulder 32, and the third barrier 80 may directly contact the plug 34.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:

forming an upper interlayer dielectric overlying an optical modulator and a photodetector, wherein the photodetector comprises a shoulder and a plug;

forming an etch stop overlying the upper interlayer dielectric, wherein the etch stop is a first distance from an uppermost surface of the optical modulator, the etch stop is a second distance from an uppermost surface of the shoulder, and the etch stop is a third distance from an uppermost surface of the plug, and the first distance, the second distance, and the third distance are all different from each other; and forming a first contact, a second contact, and a third contact through the upper interlayer dielectric, wherein the first contact is in electrical communication with the optical modulator, the second contact is in electrical communication with the shoulder, and the third contact is in electrical communication with the plug, and wherein the first contact, the second contact, and the third contact are formed with three different aspect ratios.

2. The method of claim 1 wherein forming the first contact comprises:

forming a lower first part electrically connected to the optical modulator; and forming an upper first part electrically connected to the lower first part.

3. The method of claim 2 wherein forming the upper first part comprises forming the upper first part comprising about 60 weight percent or more copper.

4. The method of claim 2 further comprising forming an interconnect, wherein the upper first part is electrically connected to the interconnect.

5. The method of claim 4 wherein forming the first contact comprises;

forming a via through the upper interlayer dielectric for the first contact;

filing the via with a conductive material comprising tungsten;

removing a portion of the conductive material comprising tungsten from the via to form the lower first part; and forming the upper first part overlying the lower first part.

6. The method of claim 1 wherein forming the first contact and the third contact comprises:

forming a via through the upper interlayer dielectric for the first contact and forming a via through the upper interlayer dielectric for the third contact, wherein the via for the first contact is formed before the via for the third contact.

7. The method of claim 1 wherein forming the third contact comprises forming the third contact with a different composition than the first contact.

8. The method of claim 1 wherein forming the first contact comprises:

forming a lower first part comprising tungsten at about 60 weight percent or more; and forming an upper first part electrically connected to the lower first part, wherein the upper first part comprises copper at about 60 weight percent or more.

9. The method of claim 8 wherein forming the third contact comprises forming the third contact wherein the third contact comprises copper at about 60 weight percent or more.

10. The method of claim 1 wherein forming the etch stop comprises forming the etch stop from an electrically insulating material.

11. The method of claim 1 wherein forming the first contact and the third contact comprises forming the first contact and the third contact from the same material.

12. The method of claim 1 wherein:
forming the optical modulator comprises forming the optical modulator overlying a lower interlayer dielectric; and
forming the photodetector comprises forming the photodetector overlying the lower interlayer dielectric.

13. The method of claim 1 wherein forming the second contact and the third contact comprises forming the second contact with a second length and forming the third contact with a third length wherein the second length is about three times the third length.

14. The method of claim 1 wherein forming the first contact, the second contact, and the third contact comprises forming the first contact, the second contact, and the third contact comprising about 60 weight percent copper or more.

15. A method of producing an integrated circuit comprising:
forming an upper interlayer dielectric overlying an optical modulator and a photodetector, wherein the photodetector comprises a shoulder and a plug;
forming an etch stop overlying the upper interlayer dielectric, wherein the etch stop is a first distance from an uppermost surface of the optical modulator, the etch stop is a second distance from an uppermost surface of the shoulder, and the etch stop is a third distance from an uppermost surface of the plug, and the first distance, the second distance, and the third distance are all different from each other;
forming a via through the upper interlayer dielectric for a first contact, forming a via through the upper interlayer dielectric for a second contact, and forming a via through the upper interlayer dielectric for the third contact, wherein the via for the first contact is formed before the via for the third contact; and
forming the first contact, the second contact, and the third contact in the vias through the upper interlayer dielectric for the first contact, the second contact, and the third contact, respectively, wherein the first contact is in electrical communication with the optical modulator, the second contact is in electrical communication with the shoulder, and the third contact is in electrical communication with the plug.

16. The method of claim 15 wherein:
forming the first contact and the third contact comprises forming the first contact and the third contact such that the first contact and the third contact comprise about 60 weight percent or more copper.

17. The method of claim 15 wherein forming the first contact and the third contact comprise forming the first contact and the third contact with different compositions.

18. The method of claim 15 further comprising:
forming an etch stop overlying the upper interlayer dielectric before forming the third contact.

19. The method of claim 15 wherein:
forming the first contact comprises forming the first contact wherein the first contact comprises a lower first part and an upper first part, wherein the lower first part comprises tungsten at about 60 weight percent or more, and wherein the upper first part comprises copper at about 60 weight percent or more.

20. An integrated circuit comprising:
an optical modulator overlying a substrate;
a photodetector overlying the substrate, wherein the photodetector comprises a shoulder and a plug;
an upper interlayer dielectric overlying the optical modulator and the photodetector;
an etch stop overlying the upper interlayer dielectric;
a first contact passing through the upper interlayer dielectric, wherein the first contact is in electrical communication with the optical modulator;
a second contact passing through the upper interlayer dielectric, wherein the second contact is in electrical communication with the shoulder; and
a third contact passing through the upper interlayer dielectric, wherein the third contact is in electrical communication with the plug, and wherein the first contact, the second contact, and the third contact comprise different aspect ratios.

* * * * *